(12) United States Patent
Fürst et al.

(10) Patent No.: US 7,875,841 B2
(45) Date of Patent: Jan. 25, 2011

(54) ORGANIC PIXELED FLAT DETECTOR HAVING INCREASED SENSITIVITY

(75) Inventors: Jens Fürst, Heßdorf (DE); Debora Henseler, Erlangen (DE); Hagen Klausmann, Germering (DE); Sandro Francesco Tedde, Erlangen (DE); Georg Wittmann, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 238 days.

(21) Appl. No.: 12/093,553

(22) PCT Filed: Nov. 9, 2006

(86) PCT No.: PCT/EP2006/068279

§ 371 (c)(1),
(2), (4) Date: Aug. 21, 2008

(87) PCT Pub. No.: WO2007/057340

PCT Pub. Date: May 24, 2007

(65) Prior Publication Data

US 2009/0166512 A1 Jul. 2, 2009

(30) Foreign Application Priority Data

Nov. 17, 2005  (DE) .................. 10 2005 055 278

(51) Int. Cl.
*H01L 27/30* (2006.01)
(52) U.S. Cl. ..................... 250/208.1; 257/72
(58) Field of Classification Search ............. 250/208.1, 250/370.01, 370.08, 370.09, 370.12, 370.14; 378/98.8; 348/308; 257/40, 72, E27.132, 257/E27.133, E27.14, E27.146
See application file for complete search history.

(56) References Cited

U.S. PATENT DOCUMENTS

| 6,005,238 | A | 12/1999 | Mei et al. ................. 250/208.1 |
| 6,600,160 | B2 | 7/2003 | Kobayashi et al. ..... 250/370.14 |
| 6,806,473 | B2 | 10/2004 | Honda et al. ........... 250/370.11 |
| 7,504,655 | B2 * | 3/2009 | Parker et al. ................. 257/40 |
| 2002/0036291 | A1 * | 3/2002 | Parker et al. ................. 257/72 |
| 2002/0038999 | A1 * | 4/2002 | Cao et al. .................... 313/503 |
| 2003/0146436 | A1 * | 8/2003 | Parker et al. ................. 257/72 |
| 2004/0135911 | A1 | 7/2004 | Nathan et al. .......... 257/E27.14 |
| 2004/0159793 | A1 | 8/2004 | Brabec et al. .......... 250/370.11 |
| 2005/0184306 | A1 * | 8/2005 | Parker et al. ................. 257/99 |
| 2009/0166512 | A1 * | 7/2009 | Furst et al. ................ 250/208.1 |

FOREIGN PATENT DOCUMENTS

EP  1 376 697 A1  1/2004

OTHER PUBLICATIONS

Street et al. "Image sensors combining an organic photoconductor with a-Si:H matrix addressing," J. of Non-Crystalline Solids, vol. 299 (pp. 1240-1244), Apr. 2003.
Street et al., "New materials and process for flat panel X-ray detectors," IEE Proc.: Circuits and Systems, vol. 150 (pp. 250-257), Aug. 2003.
International Search Report for International Application No. PCT/EP2006/068279 (4 pages), Nov. 9, 2006.

* cited by examiner

*Primary Examiner*—John R Lee
(74) *Attorney, Agent, or Firm*—King & Spalding L.L.P.

(57) ABSTRACT

An organic pixel eel flat detector has increased sensitivity. This is obtained by a preamplification at the pixel level.

17 Claims, 3 Drawing Sheets

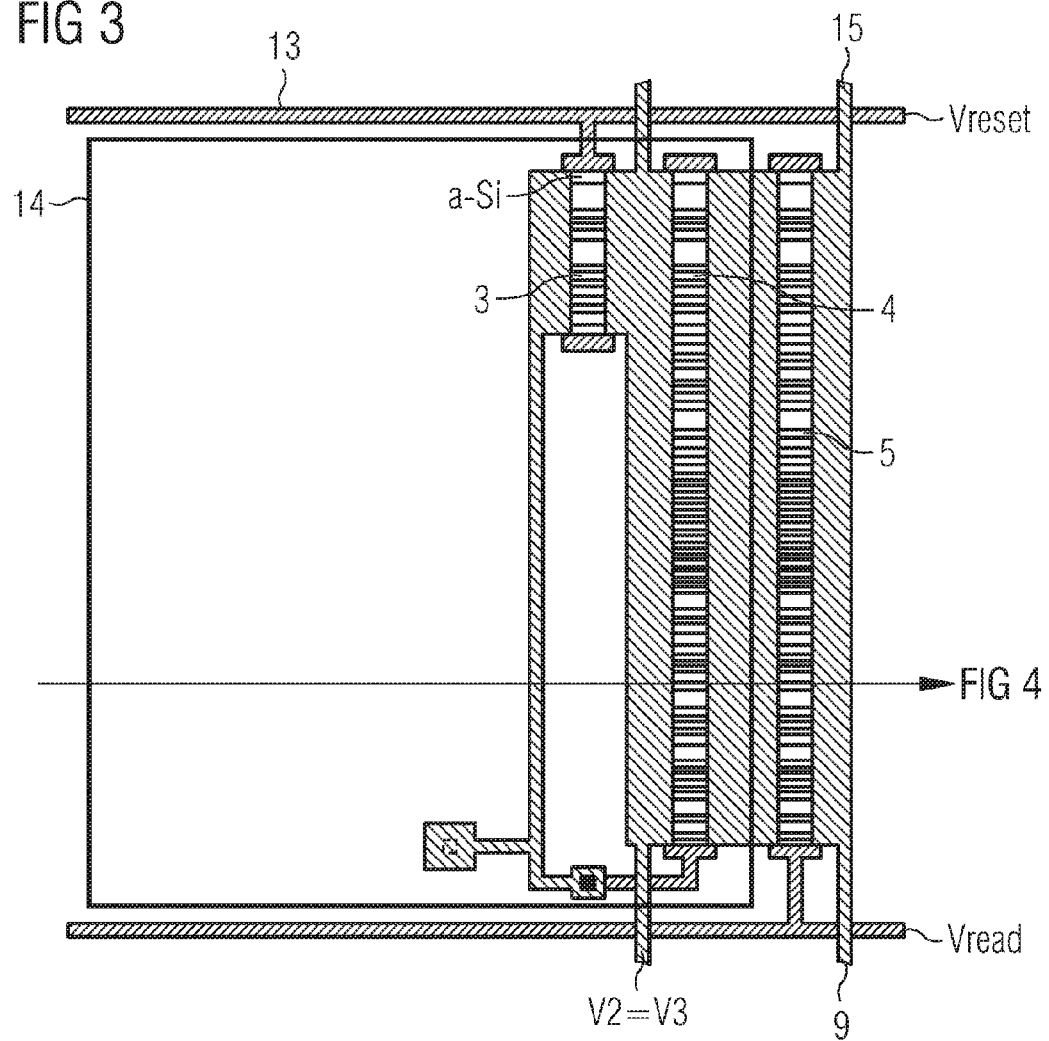
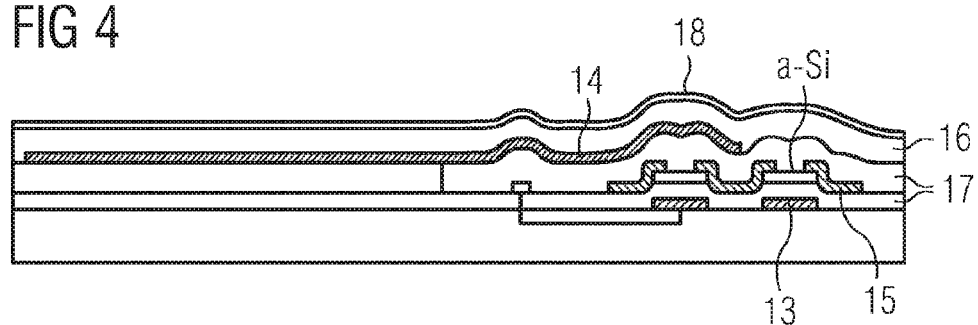

ORGANIC PIXELED FLAT DETECTOR HAVING INCREASED SENSITIVITY

CROSS-REFERENCE RELATED APPLICATIONS

This application is a U.S. national stage application of International Application No. PCT/EP2006/068279 filed Nov. 9, 2006, which designates the United States of America, and claims priority to German application number 10 2005 055 278.1 filed Nov. 17, 2005, the contents of which are hereby incorporated by reference.

TECHNICAL FIELD

The invention relates to an organic pixeled flat detector having increased sensitivity.

BACKGROUND

Inorganic flat detectors are known, which capture radiation by way of a photodetector and a scintillator and have increased sensitivity.

A-Si thin film transistors and a-Si PIN diodes are combined in commercially available flat detectors (for x-rays and other radiation). However these detectors are very complex in terms of manufacturing, in other words expensive, particularly as a result of the PIN diodes. Photodiodes based on organic semiconductor materials allow pixeled flat detectors with high external quantum efficiencies (50 to 85%) to be produced in the visible range of the spectrum. The thin organic film systems used here can be cost-efficiently manufactured using known manufacturing methods such as spin coating, doctor blade or printing processes and thus allow for cost savings, particularly for large-scale flat detectors. US 2003/0025084 for example discloses a promising application of such organic flat detectors as x-ray flat detectors e.g. within the field of medical imaging, since the light of a scintillator layer is typically detected here on relatively large surfaces of at least several centimeters.

US 2004/0135911 describes an inorganic flat detector, which discloses an inorganic p-i-n photodiode, for instance having a photoactive layer including amorphous selenium, which is connected to an amplifying circuit comprising several thin film transistors. The disadvantage here in addition to the use of expensive PIN diodes also consists in the need for an additional resistor $R_{load}$ in each column.

A conventional flat detector based on PIN diodes is also known from the publication U.S. Pat. No. 6,600,160 B2, said flat detector also having, in addition to the significant disadvantage that photosensitive elements, in other words the PIN diodes, are uneconomical to manufacture, a circuit that only includes one amplifier, but however indicating an arrangement therefor in which an additional precise current source is needed for each column to be read out.

SUMMARY

A cost-effective flat detectors can be made available according to an embodiment, by a pixeled flat detector having rows and columns of pixels, each comprise at least one organic photodiode, a reset transistor, an amplifying transistor and a read transistor, wherein the materials of the organic photodiode is selected from the group of the following materials:
  pixel anode: Au, Pd, Pt, ITO;
  organic semiconductor: blend of C60 or PCBM and P3HT or PPV;
  semi-transparent cathode: Ba, Ca, Mg, LiF or CsF.

According to a further embodiment, the organic diode can be connected to a supply voltage $V_1$ which is common to all pixels. According to a further embodiment, the organic photodiode can be directly connected to the gate contact of the amplifying transistor and to the source contact of the reset transistor in the pixel. According to a further embodiment, According to a further embodiment, the drain contact of the readout transistor can be connected to the source contact of the amplifying transistor in the pixel and/or the latter in turn being connected to the reset transistor and/or photodiode by way of its gate. According to a further embodiment, the potential V2 at the drain contact of the reset transistor can be common to all pixels. According to a further embodiment, the potential V3 at the drain contact of the amplifying transistor can be common to all pixels. According to a further embodiment, the potentials V2 and V3 may be equal. According to a further embodiment, V2 and V3 may not be equal. According to a further embodiment, one or several organic transistors can be made of amorphous silicon and/or LTPS, Low Temperature Poy Silicones. According to a further embodiment, the organic photodiode may comprise a semitransparent cathode with a top coat made of a material which has been selected from the group of the following materials Ag, Al or ITO. According to a further embodiment, the structured electrode of the organic photodiode may overlap with the reset transistor. According to a further embodiment, the structured electrode of the organic photodiode additionally may overlap with the amplifying transistor. According to a further embodiment, the structured electrode of the organic photodiode also may overlap with the readout transistor. According to a further embodiment, the organic semiconductor layer may be holohedral. According to a further embodiment, the organic semiconductor layer can be structured at the pixel level.

BRIEF DESCRIPTION OF THE DRAWINGS

The invention is described in more detail below with reference to 4 Figures, which relate to the preferred embodiments of the invention, in which;

FIG. 3 shows a top view of an active organic pixel and FIG. 4 shows the cross-section through an active pixel marked in FIG. 3.

DETAILED DESCRIPTION

Figure 1:
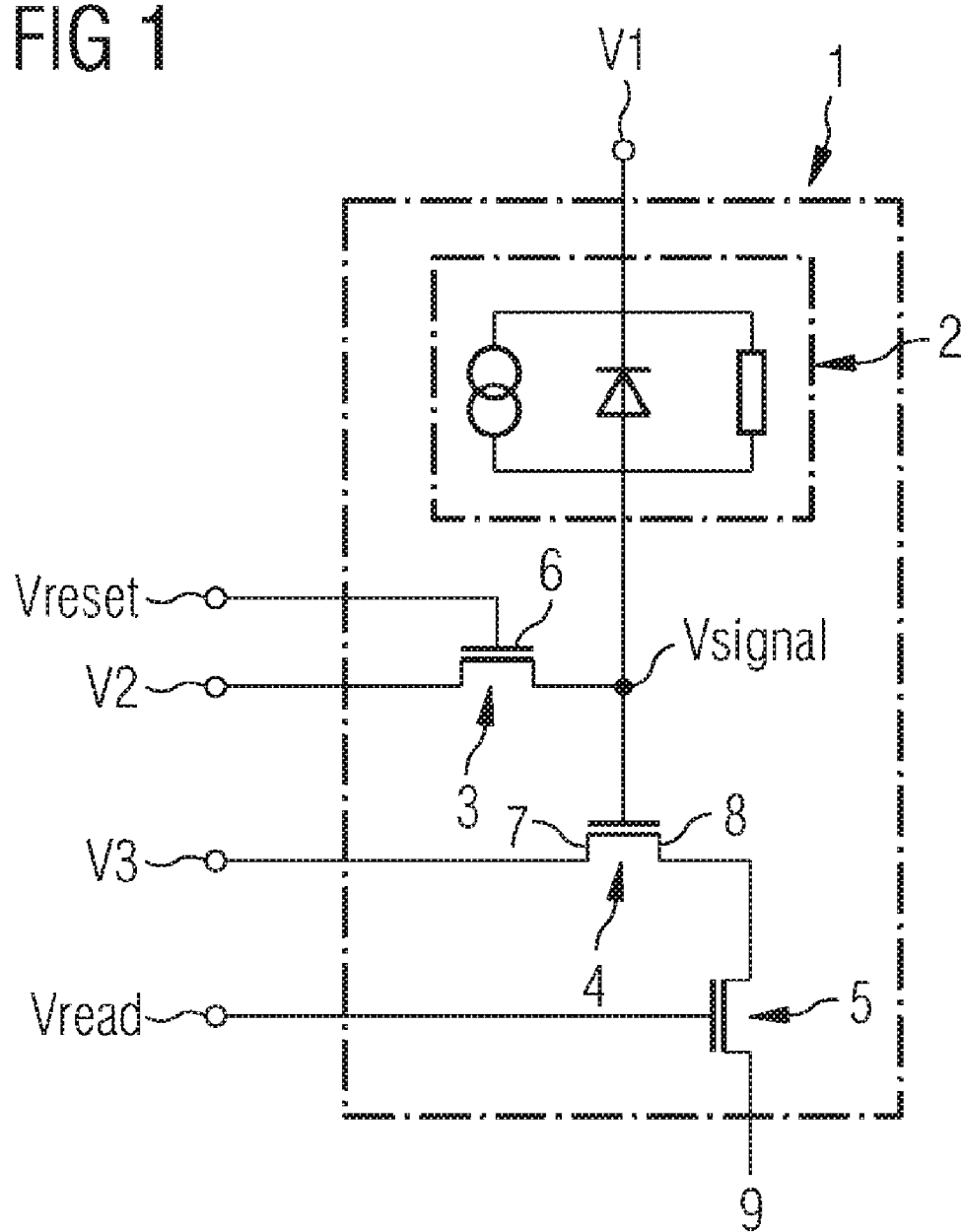
FIG. 1 shows the diagram of a switching circuit of an active pixel.

According to various embodiments, a pixeled flat detector has rows and columns of pixels, each of which includes at least one organic photodiode, a reset transistor, an amplifying transistor and a read transistor.

The present unit composed of photodiodes, transistors and associated lines is understood as a "pixel". The pixel includes the organic photodiode which can be manufactured cost-effectively, said photodiode essentially distinguishing the subject matter from known flat detectors.

In accordance with an embodiment, the pixeled flat detector includes large active-matrix-detector arrays with more than 200, for instance more than 1000 lines. With such large arrays, the noise contributions of the readout electronics system (also known as "amplifying noise") and the supply lines (thermal noise on the data line as well as extrinsic noise as a result of capacitive coupling with external voltage sources) are typically dominant by comparison with the noise contributions of the individual pixels.

Provision is made in accordance with an embodiment to effectively reduce these noise contributions by means of preamplifying each individual pixel, in other words amplifying the resulting signal as early as the pixel level and thereby to make the use of organic photodiodes possible within the field of flat detectors. Two additional transistors per pixel are needed for this: an amplifying transistor and a reset transistor.

The different transistors, which according to an embodiment are contained in each pixel, can be constructed both inorganically and organically. The use of inorganic transistors is thus possible inter alia because thin film transistors made of amorphous silicon are technologically well developed by the flat screen industry and are thus available cheaply.

However provision is also made in accordance with an embodiment to use organic transistors in whole or in part.

According to an advantageous embodiment of an embodiment, provision is made for organic diodes to be connected to a supply voltage $V_1$ which is common to all pixels. During illumination, this results in a change in the voltage $V_{signal}$, which is reset to voltage V2 prior to each illumination cycle with a voltage pulse $V_{reset}$ on the gate of the reset transistor.

According to an embodiment, the organic photodiode is directly connected to the amplifying transistor and the reset transistor in the pixel.

According to an embodiment, the readout transistor is connected to the amplifying transistor in the pixel, and the amplifying transistor is in turn connected to the reset transistor and the photodiode.

The term "organic" in conjunction with the components comprising a diode and/or transistor is very general here and includes the English meaning of "plastics". In particular other compounds and polymers which do not necessarily contain carbon as well as metal-organic materials, all types of blends and polymer mixtures or mixtures of non-polymer compounds such as oligomers and monomers are thus to be included here. Silicones or other common plastics, in other words all materials in addition to inorganic semiconductors, which conventionally account for the classical p-i-n diodes, are included here for instance.

An organic photodiode according to an embodiment includes at least the layers comprising a substrate, lower electrode, photoactive layer, upper electrode and if necessary an encapsulation. The substrate can be produced from a glass having a thickness range of 50 µm to 2 mm, from a flexible plastic or metal film or any other conventional material. It may be advantageous here if further components such as transistors are arranged on the substrate in addition to the organic photodiode. The arrangement on a substrate shortens lines, simplifies production steps and essentially saves on costs.

The preamplification of the pixels according to various embodiments with organic photodiodes naturally does not preclude the flat detector having still further means of amplifying the signal. By way of example, resistors, capacitors, further diodes and/or transistors may be used to amplify the signal.

FIG. 1 shows an actively amplifying pixel 1 according to the an embodiment. Each pixel 1 contains an organic photodiode 2, a reset transistor 3, an amplifying transistor 4 and a read transistor 5. The organic photodiode 2 is connected to a supply voltage V1 which is common to all pixels in the example shown here. During illumination, the supply voltage results in a change in the voltage $V_{signal}$, which is reset to the voltage V2 prior to each illumination cycle with a voltage pulse $V_{reset}$ on the gate 6 of the reset transistor 3. Following illumination, the signal is read out via the amplifying transistor 4, to the drain side 7 of which the voltage V3 is applied and the source side 8 of which is connected to the data line 9 by way of the read transistor 5 and to the readout electronics system exclusively by way of said data line 9. The supply voltages V2 and V3 are likewise common to all pixels. They can be at the same voltage level and are connected by way of a common line. It is however advantageous to apply different voltages V2 and V3 across two separate lines in order to optimize the signal amplification.

As is apparent, the photodiode is directly connected to the gate contact of the amplifying transistor and to the source contact of the reset transistor. The drain contact of the readout transistor 5 is connected to the source contact 8 of the amplifying transistor 4; the latter is in turn connected to the reset transistor 3 and the photodiode 2 by way of its gate.

Exemplary voltage values are +15V for V1, +10V for V2 and +20V for V3. The voltages Vreset and Vread form pulsed signals, which are switched between the values −5V (OFF) and +15V (ON) for instance.

Figure 2:
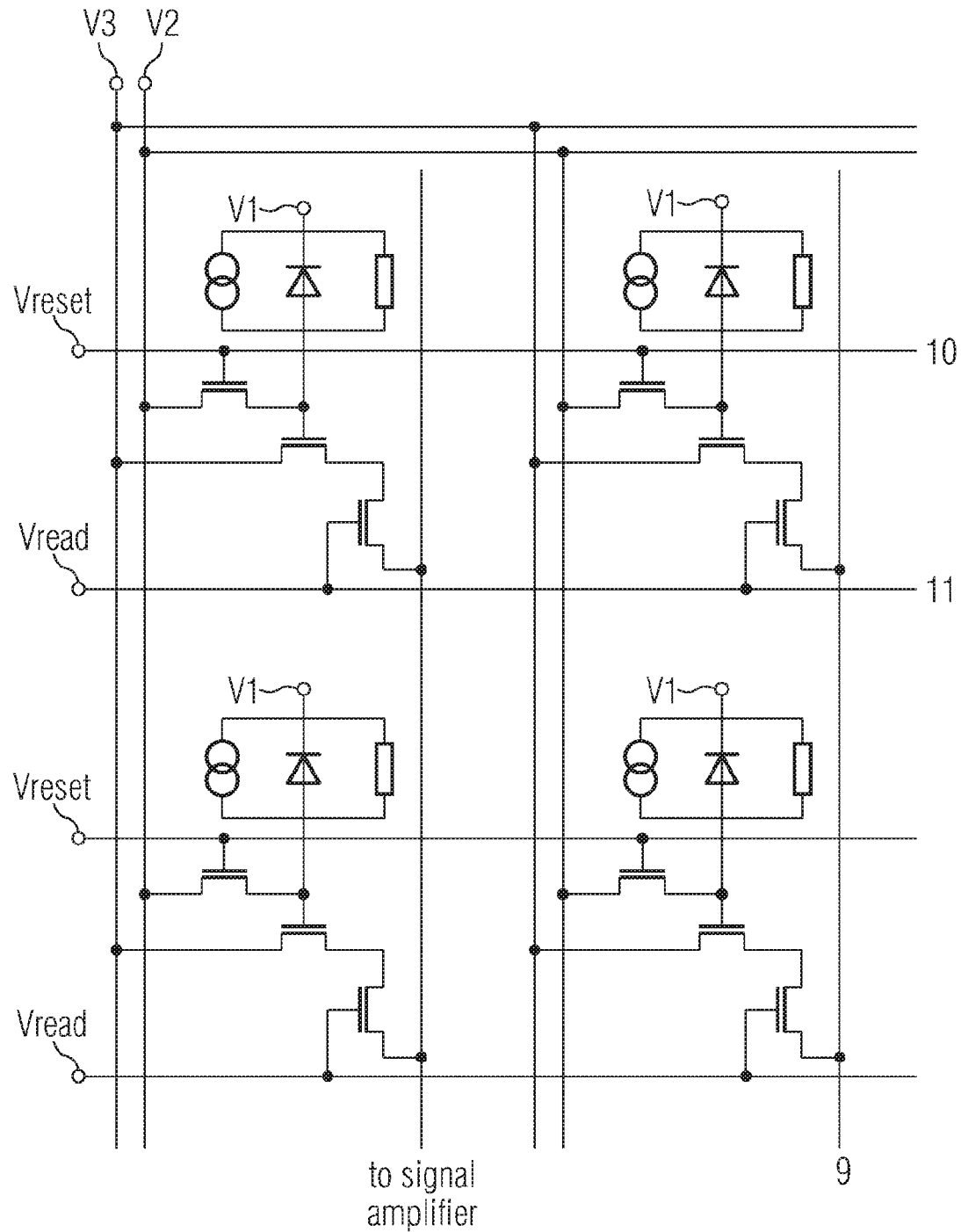
FIG. 2 shows the diagram of an array made of two lines and two columns of a flat detector.

FIG. 2 shows a schematic representation of the switching circuit for an array comprising several active pixels 1 as in FIG. 1. Two drivers 10, 11 for the pulsed supply voltages Vreset and Vread are required per row. A signal amplifier is connected to each column by way of the line 9. Furthermore, each pixel is connected to the supply lines for V1, V2 and V3 which are common to this example. The terminal for the supply voltage V1 is a large-surface electrode for instance, which is overlapped with the overall array and is not shown in the FIG. The common supply voltages V2 and V3 are each combined here column by column for instance, with the individual strands at the edge of the array each being combined to form a common terminal. In principle, it is also possible to combine these strands firstly row by row and then to connect them to a supply line at the right edge. It is likewise possible to design the supply voltage V1 in a different manner than as is shown.

The supply voltages V2 and/or V3 can be connected for all pixels, as shown in FIG. 2, but they can also be designed for individual pixels. The potential of V2 can be equal to or not equal to that of V3.

FIG. 3 shows a top schematic view of an active organic pixel; FIG. 4 shows a cross-section through the active organic pixel, at the point shown in FIG. 3.

In this example, the voltage supplies for V2 and V3 are combined in a vertical line, so these two potentials are thus identical here.

According to a different embodiment, the two potentials V2 and V3 are not equal.

Referring back to FIG. 3 it can still be seen that in the example shown there, the pixel anode 14 overlaps with the reset thin film transistor 3 (TFT) and the amplifier thin film transistor 4 (TFT). Furthermore, gate 13 and source/drain 15 can be seen. This significantly increases the filling factor compared with a design without an overlap between the anode and transistors. The effective filling factor of an organic photodiode pixel is determined in this instance by the surface of the pixel anode 14 plus a stability range of a few µm surrounding this. To further increase the filling factor, an additional overlap with the readout transistor 5 is also possible, which however also introduces the disadvantage of additional parasitic capacitors. For applications, in which the filling factor is less critical, it is possible to dispense with the overlap with reset transistor 3 and/or amplifying transistor 4.

In the case of a flat detector according to an embodiment, in accordance with one exemplary embodiment, the structured electrode of the organic photodiode overlaps with the reset transistor and/or with the amplifying transistor and/or with the readout transistor.

In the case of a flat detector according to an embodiment, the organic semiconductor layer is holohedral in accordance with a further embodiment.

In the case of a flat detector according to an embodiment, the organic semiconductor layer is structured at the pixel level in accordance with a further embodiment.

In the example in FIG. 4, both the organic semiconductor layer 16 as well as the common (here semitransparent) cathode 18 are holohedral and are arranged on all the pixels of the array in an unstructured fashion. The organic semiconductor 16 can essentially also be structured upon the geometry of the individual pixel anodes. The upper electrode 18 is always connected at a potential V1.

The function of the pixel anode 14 and pixel cathode 18 can also change compared with the example in FIG. 4, only the electrode connected to the amplifying and reset transistor is structured in the individual pixel and the other electrode is connected thereto. The organic semiconductor layer 16 can include several organic sublayers and additional inorganic barrier layers can be applied above and/or below the organic layers.

Typical materials and layer thicknesses of the transistor superstructures are made of amorphous silicon:
gate metal: Cr or Al, between 50 and 500 nm
first passivation: SiNx or SiOxNy, between 100 and 500 nm
a-Si: between 30 and 300 nm (partially doped)
source/drain metal: Cr or Al, between 50 and 500 nm
second passivation. SiNx, SiOxNy or organic photoresist, between 100 and 500 nm Typical materials for organic transistors are as conductors: polymers based on polyaniline; as semiconductors: polymers based on polythiophene; and as insulators: polymers based on polyethylene. The layer thicknesses differ depending on the design of the transistor, usually within the field of thin film layer technology.

Typical materials and layer thicknesses of the organic diodes:
pixel anode: Au, Pd, Pt, ITO between 20 and 200 nm
organic semiconductor: blend of organic electron transport components (e.g. C60 or PCBM= Phenyl-C61-butonic acid methyl ester) and an organic hole transport component (e.g. a P3AT=Poly-3-alkylthiophene or a PPV=Polyphenylenvinylene), between 50 and 500 nm
semitransparent cathode: first layer composed of Ba, Ca, Mg, LiF or CsF between 1 and 10 nm and if necessary a top layer made of Ag, Al or ITO with a layer thickness between 3 and 30 nm.

The entire component is in most cases finally protected against the effect of oxygen and moisture by means of an encapsulation (e.g. glass cover or thin film encapsulation).

In a further exemplary embodiment, the thin film transistors can be realized as organic field effect transistors (OFETs). This could also provide for even more cost-effective manufacturing processes for the transistors. Such a design would also be suited to manufacturing flexible and/or moldable detector arrays on flexible substrates.

The advantage of the actively amplified organic detector array according to various embodiments consists in a reduction in the weight of the noise contributions which occur in the data line and in the amplifier. The effect of this reduction on the total noise is higher, the larger the array is. With x-ray detector arrays for fluoroscopy and radiography applications, the number of lines typically lies between 1000 and 3000. In this range, the aforementioned noise contributions arising after the pixel result in a portion of typically 40-90% of the total noise. The effect of the noise contributions is herewith reduced with the use of actively amplified pixels such that the signal is amplified prior to the occurrence of specific noise contributions. The noise thereby cannot be reduced overall, but the early amplification significantly increases the signal-to-noise ratio and the sensitivity of the detector.

The degree of improvement in the signal-to-noise ratio depends on the gain G of the amplifying pixel. The gain specifies the ratio of the photo charges generated in the pixel in relation to the charge quantity at the output amplifier. It is provided by means of the following formula:

$$G=g*t/C$$

in which g is the transconductance of the amplifying transistor, t is the sampling time required to read out a pixel, and C is the pixel capacitance. Typical values of these variables during the use of a-Si transistors are:
$G=1\times10^{-6}$ to $5\times10^{-6}$ A/V
T=10 to 50 µs
C=1 to 5 pF (with a pixel pitch between 80 µm and 200 µm).

Typical gain factors here lie in the range between 3 and 30.

Simulations show that with a gain factor of 10 for an organic detector array having 150 µm pixel pitch, 20 µs readout time and 4 pF pixel capacitor, the signal-to-noise ratio can be improved by a factor 2 to 3 (compared with a pixel without amplification, only with a simple readout transistor).

The smallest detectable signal is determined by the total noise related to the input of the pixel amplifier. The use of actively amplifying pixels in the organic detector array according to various embodiments can reduce to 1200 electrons this input noise value for an array of 1000×1000 pixels according to simulations of 2000 electrons. The factor is even greater for larger arrays. With an input noise value of below approximately 1500 electrons, individual x-ray quanta can be detected with an x-ray detector.

The improvement according to various embodiments may thus allow the commercial use of organic photodiodes in the x-ray flat detectors for low dose ranges.

Thus, an organic pixeled flat detector having increased sensitivity can be obtained by means of preamplification at the pixel level.

The invention claimed is:

1. A pixeled flat detector having rows and columns of pixels arranged in a pixel array, each comprise at least one organic photodiode, a reset transistor, an amplifying transistor and a read transistor, wherein the organic photodiode comprises:
   a pixel anode formed from material selected from the group consisting of Au, Pd, Pt, and ITO;
   an organic semiconductor layer formed from a blend of (a) an organic electron transport component selected from the group consisting of C60 and PCBM and (b) an organic hole transport component selected from the group consisting of P3HT and PPV; and
   a semitransparent cathode formed from material selected from the group consisting of Ba, Ca, Mg, LiF and CsF;
   wherein the organic photodiode is connected to a supply a voltage $V_1$ which is common to all pixels;
   wherein the organic semiconductor layer and the semitransparent cathode extend continuously over the entire pixel array in an unstructured fashion; and
   wherein the pixel anode overlaps the reset transistor and the amplifying transistor, but does not substantially overlap the read transistor.

2. The flat detector according to claim 1, wherein:
the amplifying transistor and the reset transistor comprise field effect transistors; and
the organic photodiode is directly connected to a gate contact of the amplifying transistor and to a source contact of the reset transistor in the pixel.

3. The flat detector according to claim 1, wherein:
the readout transistor and the amplifying transistor comprise field effect transistors; and
a drain contact of the readout transistor is connected to a source contact of the amplifying transistor in the pixel.

4. The flat detector according to claim 1, wherein:
the reset transistor comprises a field effect transistor; and
a potential V2 at a drain contact of the reset transistor is common to all pixels.

5. The flat detector according to claim 1, wherein:
the amplifying transistor comprises a field effect transistor; and
a potential V3 at a drain contact of the amplifying transistor is common to all pixels.

6. The flat detector according to claim 1, wherein:
a potential V2 at a drain contact of the reset transistor is common to all pixels;
a potential V3 at a drain contact of the amplifying transistor is common to all pixels; and
the potentials V2 and V3 are equal.

7. The flat detector according to claim 1, wherein:
a potential V2 at a drain contact of the reset transistor is common to all pixels;
a potential V3 at a drain contact of the amplifying transistor is common to all pixels; and
the potentials V2 and V3 are not equal.

8. The flat detector according to claim 1, comprising one or more organic transistors made of amorphous silicon and/or LTPS, Low Temperature Poy Silicones.

9. The flat detector according to claim 1, wherein the organic photodiode comprises a semitransparent cathode with atop coat made of a material which has been selected from the group of the following materials Ag, Al or ITO.

10. The flat detector according to claim 1, wherein a structured electrode of the organic photodiode overlaps with the reset transistor.

11. The flat detector according to claim 1, wherein a structured electrode of the organic photodiode additionally overlaps with the amplifying transistor.

12. The flat detector according to claim 1, wherein a structured electrode of the organic photodiode also overlaps with the readout transistor.

13. The flat detector according to claim 1, wherein the organic semiconductor layer is structured at the pixel level.

14. A pixeled flat detector having rows and columns of pixels arranged in a pixel array, each comprise at least one organic photodiode, a reset transistor, an amplifying transistor and a read transistor, wherein the organic photodiode comprises a pixel anode, an organic semiconductor layer and a semitransparent cathode and wherein the materials of:
the pixel anode is selected from the group consisting of: Au, Pd, Pt, and ITO;
the organic semiconductor layer is selected from the group consisting of: blend of C60 or PCBM and P3HT or PPV; and
the semitransparent cathode is selected from the group consisting of: Ba, Ca, Mg, LiF, and CsF;
wherein the organic photodiode is connected to a supply voltage $V_1$ which is common to all pixels;
wherein the organic semiconductor layer and the semitransparent cathode extend continuously over the entire pixel array in an unstructured fashion; and
wherein the pixel anode overlaps the reset transistor and the amplifying transistor, but does not substantially overlap the read transistor.

15. The flat detector according to claim 14, wherein:
the amplifying transistor and the reset transistor comprise field effect transistors; and
the organic photodiode is directly connected to a gate contact of the amplifying transistor and to a source contact of the reset transistor in the pixel.

16. The flat detector according to claim 14, wherein:
the readout transistor and the amplifying transistor comprise field effect transistors; and
a drain contact of the readout transistor is connected to a source contact of the amplifying transistor in the pixel.

17. The flat detector according to claim 14, wherein:
the reset transistor comprises a field effect transistor; and
a potential V2 at a drain contact of the reset transistor is common to all pixels.

* * * * *